(12) United States Patent
Hayashi et al.

(10) Patent No.: US 6,775,110 B1
(45) Date of Patent: Aug. 10, 2004

(54) MAGNETORESISTANCE EFFECT DEVICE WITH A TA, HF, OR ZR SUBLAYER CONTACTING AN NIFE LAYER IN A MAGNETO RESISTIVE STRUCTURE

(75) Inventors: Kazuhiko Hayashi, Tokyo (JP); Shigeru Mori, Tokyo (JP); Masafumi Nakada, Tokyo (JP)

(73) Assignee: TDK Corporation, Tokyo (JP)

( * ) Notice: Subject to any disclaimer, the term of this patent is extended or adjusted under 35 U.S.C. 154(b) by 1021 days.

(21) Appl. No.: 09/076,111

(22) Filed: May 12, 1998

(30) Foreign Application Priority Data

May 14, 1997 (JP) .............................................. 9-123796

(51) Int. Cl.⁷ ................................................. G11B 5/39
(52) U.S. Cl. ............................... 360/324.1; 360/324.12
(58) Field of Search ........................... 360/113, 324.1, 360/324.11, 324.12, 324.2, 317

(56) References Cited

U.S. PATENT DOCUMENTS

| | | | | |
|---|---|---|---|---|
| 5,717,550 A | * | 2/1998 | Nepela et al. | 360/113 |
| 5,761,011 A | * | 6/1998 | Miyauchi et al. | 360/113 |
| 5,764,056 A | * | 6/1998 | Mao et al. | 324/252 |
| 5,766,743 A | * | 6/1998 | Fujikata et al. | 428/212 |
| 5,793,279 A | * | 8/1998 | Nepela | 338/32 R |
| 5,796,560 A | * | 8/1998 | Saito et al. | 360/113 |
| 5,828,525 A | * | 10/1998 | Iwasaki et al. | 360/113 |
| 5,843,589 A | * | 12/1998 | Hoshiya et al. | 428/692 |
| 5,852,533 A | * | 12/1998 | Miyauchi et al. | 360/113 |
| 5,867,351 A | * | 2/1999 | Gill | 360/113 |
| 5,869,963 A | * | 2/1999 | Saito et al. | 324/252 |
| 5,880,913 A | * | 3/1999 | Gill | 360/113 |
| 5,889,640 A | * | 3/1999 | Hayashi et al. | 360/113 |
| 5,923,505 A | * | 7/1999 | Kroes et al. | 360/113 |

FOREIGN PATENT DOCUMENTS

| | | |
|---|---|---|
| JP | 2-61572 | 3/1990 |
| JP | 4-358310 | 12/1992 |
| JP | 6-203340 | 7/1994 |
| JP | 7-66036 | 3/1995 |
| JP | 7-202292 | 8/1995 |
| JP | 7-262529 | 10/1995 |
| JP | 6-214837 | 4/1996 |
| JP | 6-269524 | 5/1996 |
| JP | 8-204253 | 8/1996 |
| JP | 7-136670 | 12/1996 |
| JP | 9-63021 | 3/1997 |
| JP | 9-190612 | 7/1997 |
| JP | 10-143822 | 5/1998 |

OTHER PUBLICATIONS

David A. Thompson et al., "Thin Film Magnetoresistors in Memory, Storage, and Related Applications", IEEE Transactions On Magnetics, vol. MAG–11, No. 4, Jul. 1973, pp. 1039–1050.

H. Kanai et al., Collected Abstracts From 20th Scientific Lecture Conference of Japan Society of Applied Magnetics, 1996, p. 265.

* cited by examiner

Primary Examiner—Jefferson Evans
(74) Attorney, Agent, or Firm—Young & Thompson

(57) ABSTRACT

A magnetoresistance effect device has the basic structure of substrate/sublayer/NiFe layer/CoFe layer/non-magnetic layer/fixed magnetic layer/antiferromagnetic layer. The sublayer may be Ta at a film thickness of not less than 0.2 nm but less than 3.0 nm, or Hf at a film thickness of not less than 0.2 nm but not greater than 1.5 nm, or Zr at a film thickness of not less than 0.2 nm but not greater than 2.5 nm. It is permissible to use only an NiFe layer instead of the NiFe layer/CoFe layer.

13 Claims, 22 Drawing Sheets

F I G. 5
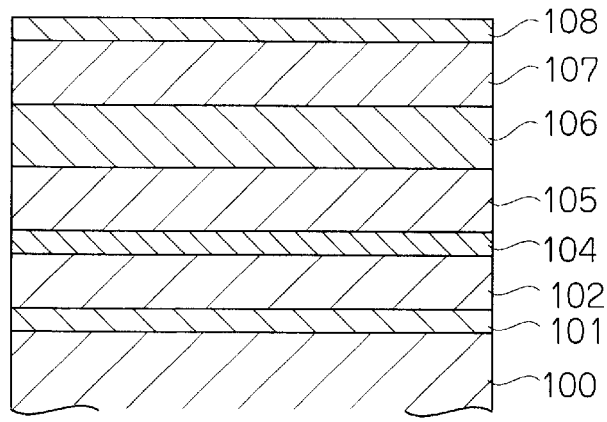
F I G. 6
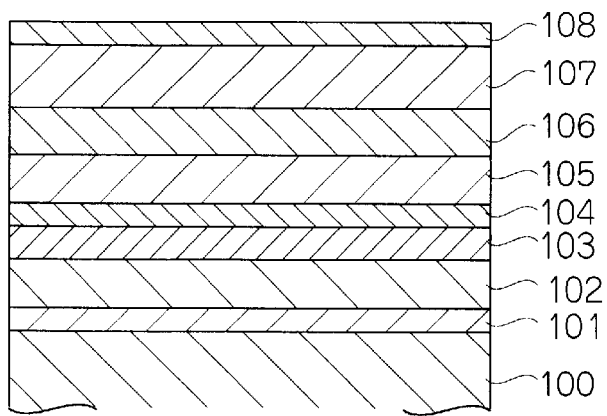

F I G. 7
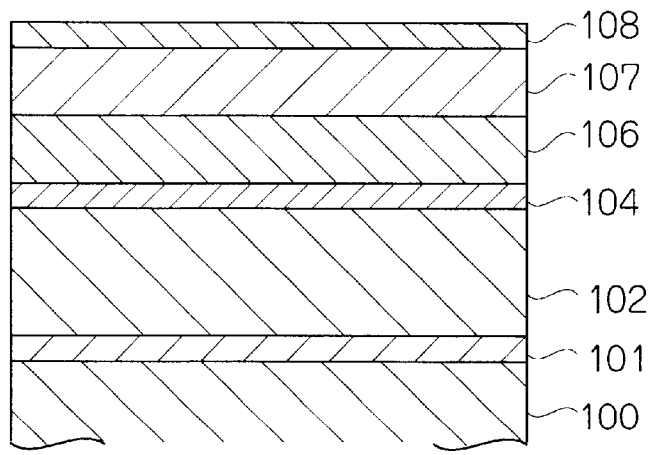
F I G. 8
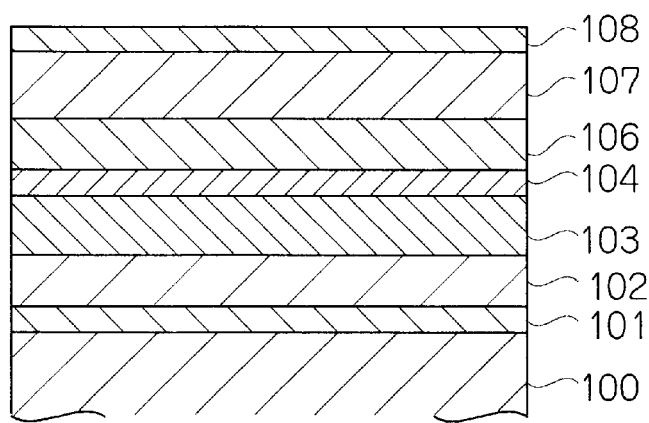

F I G. 1 5
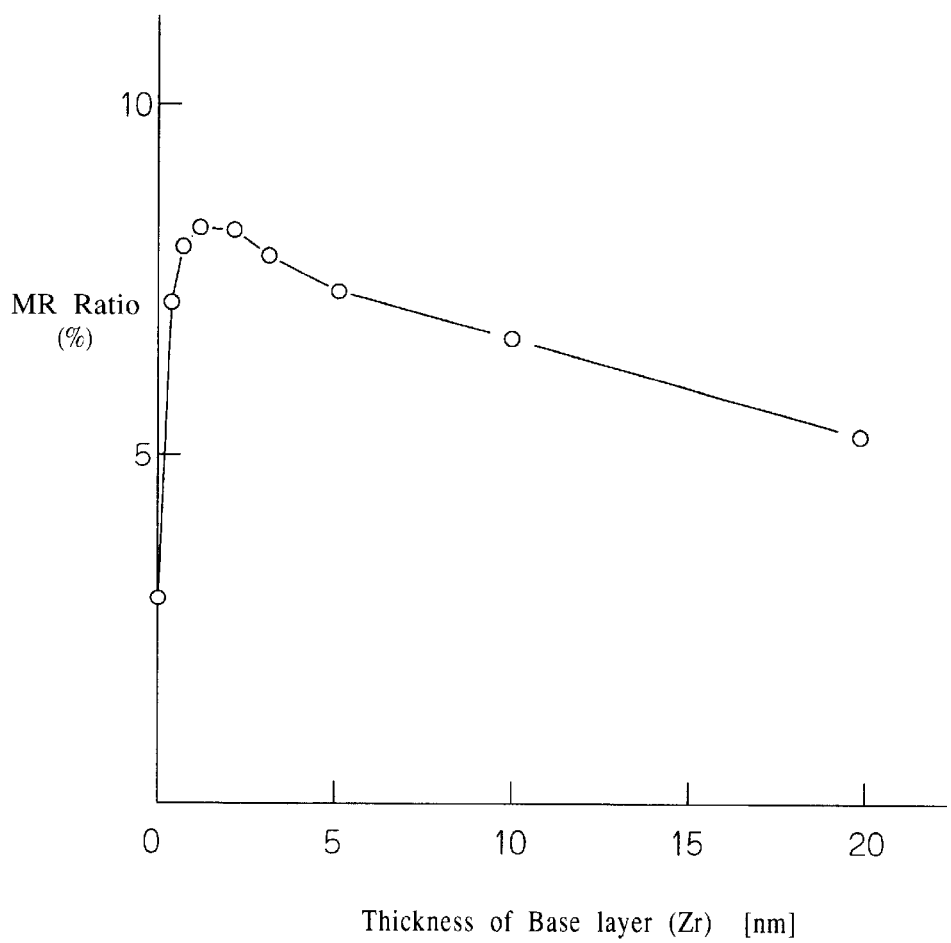

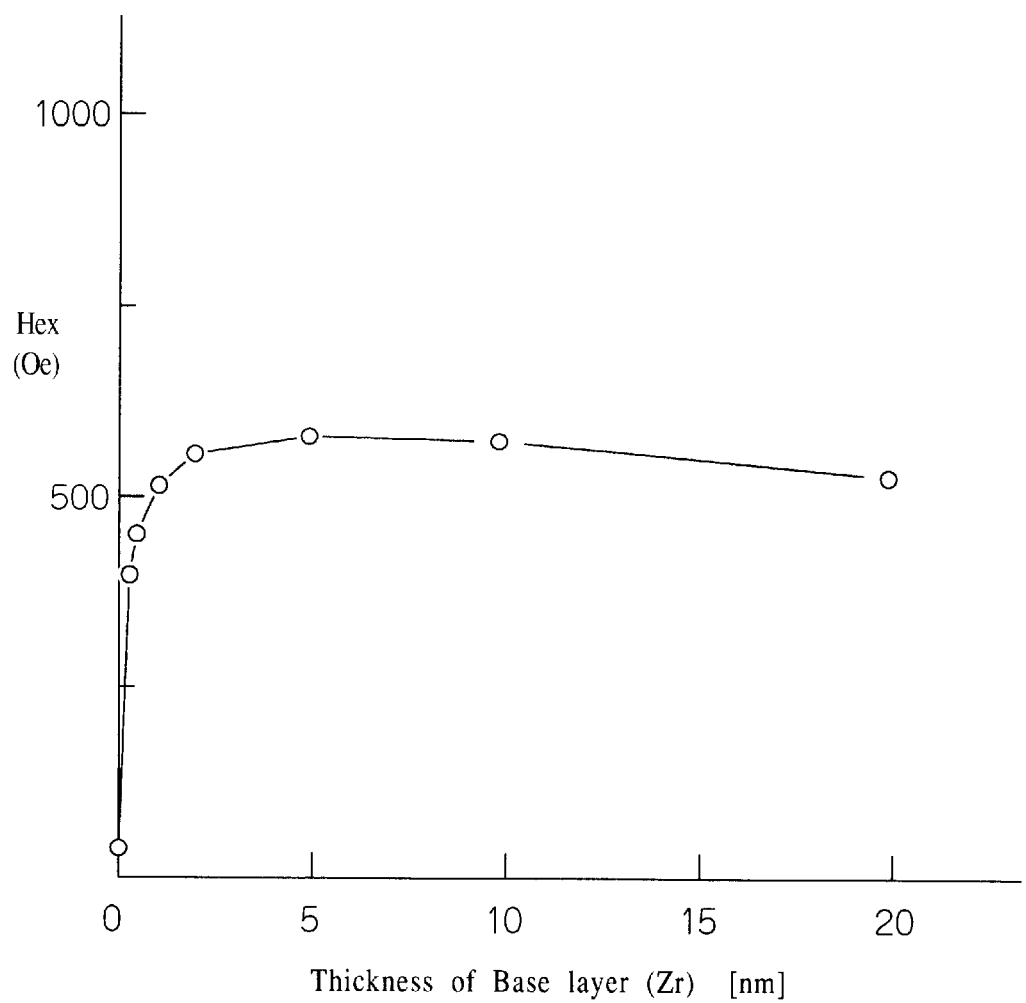
F I G. 1 6

FIG.18

| Base layer. Material and Thickness (nm) | Ta<br>3.0 | Hf<br>1.0 | Zr<br>2.0 |
|---|---|---|---|
| Mark Length Which Reproduction Output Decrease to Half (frequency)(kFCI) | 155 | 154 | 154 |
| Reproduction Output (peak to peak)(mV) | 1.5 | 1.5 | 1.5 |
| Noise | No | No | No |
| Symmetricity of Wave shape | Good | Good | Good |
| S/N (dB) | 26.1 | 26.0 | 26.0 |
| Error Rate | $10^{-6}$ or less | $10^{-6}$ or less | $10^{-6}$ or less |

FIG.19

| Antiferromagnetic layer. Material and Thickness (nm) | $Ni_{46}Mn_{54}$ 25 | $Ir_{20}Mn_{80}$ 30 | $Rh_{49}Mn_{51}$ 30 | $Pt_{49}Mn_{51}$ 30 |
|---|---|---|---|---|
| Mark Length Which Reproduction Output Decrease to Half (frequency)(kFCI) | 155 | 161 | 170 | 170 |
| Reproduction Output (peak to peak)(mV) | 1.5 | 1.7 | 1.8 | 2.1 |
| Noise | No | No | No | No |
| Symmetricity of Wave shape | Good | Good | Good | Good |
| S/N (dB) | 26.1 | 26.1 | 26.7 | 27.5 |
| Error Rate | $10^{-6}$ or less | $10^{-6}$ or less | $10^{-6}$ or less | $10^{-6}$ or less |
| 80 °C. 500 Oe 2500 Hours Change of Error Rate after Atmospheric Test | No | No | No | No |
| Current Density $2\times10^7 A/cm^2$ Conducting Test at 80 Degree Change of Resistance and Resistive Change Ratio until 1000 hours | No | No | No | No |

FIG.20

| Antiferromagnetic layer. Material and Thickness (nm) | $Fe_{50}Mn_{50}$ 25 | Ni Oxide 30 | Dual layer of NiOxide and FeOxide 30 |
|---|---|---|---|
| Mark Length Which Reproduction Output Decrease to Half (frequency)(kFCI) | 170 | 175 | 173 |
| Reproduction Output (peak to peak)(mV) | 2.3 | 2.8 | 2.5 |
| Noise | No | No | No |
| Symmetricity of Wave shape | Good | Good | Good |
| S/N (dB) | 27.4 | 28.6 | 28.1 |
| Error Rate | $10^{-6}$ or less | $10^{-6}$ or less | $10^{-6}$ or less |

FIG.21

| Thickness of NiFe film (nm) | 2 | 3 | 5 | 7 | 9 | 11 | 13 |
|---|---|---|---|---|---|---|---|
| Mark Length Which Reproduction Output Decrease to Half (frequency)(kFCI) | 145 | 150 | 154 | 155 | 154 | 152 | 151 |
| Reproduction Output (peak to peak)(mV) | 0.8 | 1.0 | 1.3 | 1.5 | 1.4 | 1.3 | 1.1 |
| Noise | No | No | No | No | No | No | No |
| Symmetricity of Wave shape | Good | Good | Good | Good | Good | Good | Good |
| S/N (dB) | 25.3 | 25.5 | 25.8 | 26.1 | 25.9 | 25.6 | 25.5 |

FIG.22

| Ni Composition of NiFe layer (at %) (Analyzed value of Target) | 78 | 80 | 81 | 82 | 83 |
|---|---|---|---|---|---|
| Mark Length Which Reproduction Output Decrease to Half (frequency)(kFCI) | 150 | 153 | 155 | 155 | 150 |
| Reproduction Output (peak to peak)(mV) | 1.1 | 1.3 | 1.5 | 1.5 | 1.0 |
| Noise | No | No | No | No | No |
| Symmetricity of Wave shape | Good | Good | Good | Good | Good |
| S/N (dB) | 25.3 | 25.8 | 26.0 | 26.1 | 25.4 |
| Error Rate | $10^{-6}$ or less | $10^{-6}$ or less | $10^{-6}$ or less | $10^{-6}$ or less | $10^{-6}$ or less |

FIG.23

| Fe Composition of CoFe layer (at %) (Analyzed value of Target) | 8 | 9 | 10 | 11 | 12 |
|---|---|---|---|---|---|
| Mark Length Which Reproduction Output Decrease to Half (frequency)(kFCI) | 150 | 153 | 155 | 155 | 150 |
| Reproduction Output (peak to peak)(mV) | 1.3 | 1.5 | 1.5 | 1.5 | 1.2 |
| Noise | No | No | No | No | No |
| Symmetricity of Wave shape | Good | Good | Good | Good | Good |
| S/N (dB) | 25.7 | 26.0 | 26.0 | 26.1 | 25.6 |
| Error Rate | $10^{-6}$ or less | $10^{-6}$ or less | $10^{-6}$ or less | $10^{-6}$ or less | $10^{-6}$ or less |

FIG. 24

| Structure | Structure of Fig.5 | Structure of Fig.6 | Structure of Fig.7 | Structure of Fig.8 |
|---|---|---|---|---|
| Mark Length Which Reproduction Output Decrease to Half (frequency)(kFCI) | 154 | 160 | 145 | 153 |
| Reproduction Output (peak to peak)(mV) | 1.4 | 1.8 | 1.1 | 1.3 |
| Noise | No | No | No | No |
| Symmetricity of Wave shape | Good | Good | Good | Good |
| S/N (dB) | 25.9 | 26.7 | 25.5 | 25.8 |
| Error Rate | $10^{-6}$ or less | $10^{-6}$ or less | $10^{-6}$ or less | $10^{-6}$ or less |

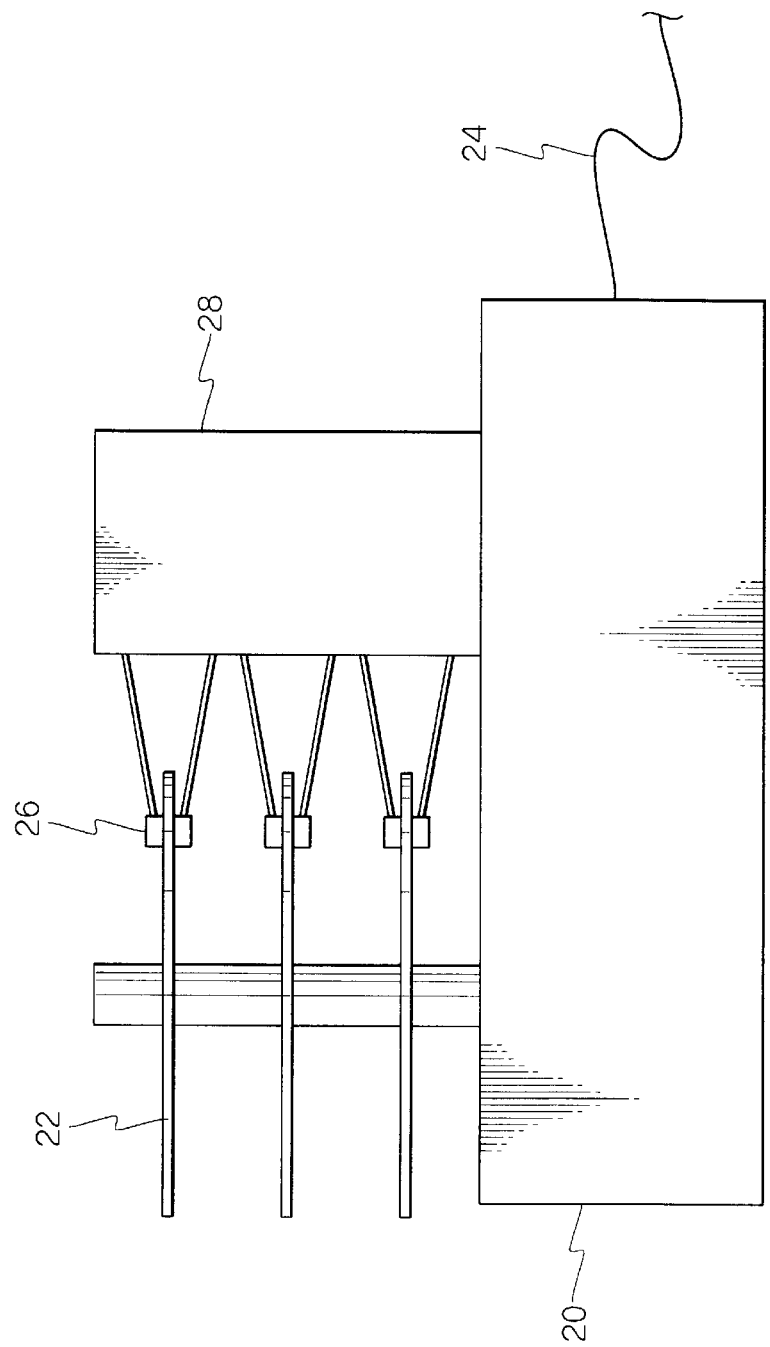

MAGNETORESISTANCE EFFECT DEVICE WITH A TA, HF, OR ZR SUBLAYER CONTACTING AN NIFE LAYER IN A MAGNETO RESISTIVE STRUCTURE

BACKGROUND OF THE INVENTION

1. Field of the Invention

This invention concerns a magnetoresistance effect device for reading information signals recorded on a magnetic storage medium, and a magnetoresistance effect sensor, magnetoresistance detection system, and magnetic storage system using the said device.

2. Description of the Related Art

Magnetic reading converters called magnetoresistance (MR) sensors and MR heads are known in the prior art. A characteristic of these devices is the ability to read data from magnetic storage medium surfaces at high linear density. An MR sensor detects magnetic field signals through resistance changes that are a function of the strength and direction of magnetic flux sensed by a reading device. Such MR sensors of the prior art operate on the anisotropic magnetoresistance (AMR) effect whereby one component of the resistance of the reading device varies as the square of the cosine of the angle subtended by the magnetization direction and the direction of sensed electric current flowing through the device. A more detailed treatment of the AMR effect is set forth in the monograph of D. A. Thompson et al. entitled "Memory, Storage, and Related Applications" in *IEEE Trans. on Mag. MAG*-11, p. 1039 (1975). With magnetic heads that use the AMR effect, vertical bias is often applied to suppress Barkhausen noise. The material used for applying this vertical bias is sometimes an antiferromagnetic material such as FeMn, NiMn, or a nickel oxide.

Recently, moreover, there have been reports of a more pronounced magnetoresistance effect wherewith resistance variation in a laminated magnetic sensor is attributable to the spin-dependent transmission of conduction electrons between ferromagnetic layers on either side of a non-magnetic layer, and to spin-dependent scattering at the interfaces incidental thereto. This magnetoresistance effect is called by such names as the "mega-magnetoresistance effect" or the "spin valve effect." Such MR sensors are made of suitable materials and exhibit improved sensitivity and larger resistance variation when compared to what is observed in sensors employing the AMR effect. In this type of MR sensor, the resistance in the plane between the pair of ferromagnetic layers separated by the nonmagnetic layer varies in proportion to the cosine of the angle subtended by the magnetization directions of the two ferromagnetic layers. Laid-open patent application H2-61572 [1990] (gazette publication) discloses a laminated magnetic structure that brings about high MR variation which is produced by the anti-parallel alignment of magnetization in magnetic layers. In this gazette publication, ferromagnetic transition metals and alloys are listed as materials that can be used in the laminar structure. Also disclosed are a structure in which an antiferromagnetic layer is added to at least one of the two ferromagnetic layers separated by the intermediate layer, and that FeMn is suitable for the antiferromagnetic layer. Laid-open patent application H4-358310 [1992] (gazette publication) discloses an MR sensor that comprises two ferromagnetic layers partitioned by an antiferromagnetic layer, wherein the magnetization directions of the two ferromagnetic layers are mutually perpendicular when the applied magnetic field is zero, and wherein the resistance between the two non-joined ferromagnetic layers varies in proportion to the cosine of the angle subtended by the magnetization directions of the two layers and is independent of the direction of current flow in the sensor. Laid-open patent application H6-203340 [1994] (gazette publication) discloses an MR sensor that is based on the effect noted above and that comprises two ferromagnetic layers separated by an antiferromagnetic layer, wherein, when the externally applied magnetic field is zero, the magnetization of adjacent antiferromagnetic layers is maintained perpendicular to the ferromagnetic layers. Laid-open patent application H7-262529 [1995] (gazette publication) discloses a magnetoresistance effect device that is a spin valve comprising a first magnetic layer/antimagnetic layer/second magnetic layer/antiferromagnetic layer structure, wherein the material used in the first and second magnetic layers is CoZrNb, CoZrMo, FeSiAl, FeSi, or NiFe, or any of these to which Cr, Mn, Pt, Ni, Cu, Ag, Al, Ti, Fe, Co, or Zn has been added. Laid-open patent application H7-202292 [1995] (gazette publication) discloses a magnetoresistance effect film comprising a plurality of soft magnetic thin films laminated on a substrate with intervening antiferromagnetic thin films, wherein an antiferromagnetic thin film is provided adjoining to one of the soft magnetic thin films that are mutually adjacent with an intervening antimagnetic thin film, wherein Hc2<Hr, where Hr is the bias magnetic field of the antiferromagnetic thin film and Hc2 is the coercive force of the other soft magnetic thin films, and wherein the antiferromagnetic thin film is made of at least one of the substances NiO, CoO, FeO, $Fe_2O_3$, MnO, or Cr, or a mixture thereof. Laid-open patent applications H6-214837 [1994] and H6-269524 [1994] (gazette publications) disclose a magnetoresistance effect film that is the magnetoresistance effect film noted above wherein the antiferromagnetic thin film is a superlattice made of two or more substances selected from among NiO, $Ni_xCo_{1-x}O$, and CoO. Laid-open patent application H7-11354 [1995] (gazette publication) discloses a magnetoresistance effect film that is the magnetoresistance effect film noted above wherein the antiferromagnetic thin film is a superlattice made of two or more substances selected from among NiO, $Ni_xCo_{1-x}O$ (where x=0.1 to 0.9), and CoO, and wherein the atomic number ratio of Ni to Co is 1.0 or higher. And laid-open patent application H7-136670 [1995] (gazette publication) discloses a magnetoresistance effect film that is the magnetoresistance effect film noted above wherein the antiferromagnetic thin film is a two-layer film wherein CoO is laminated onto NiO to a thickness of from 10 to 40 angstroms.

On page 265 of the *Dai 20-kai Nihon Oyo Jiki Gakkai Gakujutsu Koenkai Gaiyoushu* (*Collected Abstracts From 20th Scientific Lecture Conference of Japan Society of Applied Magnetics*) there are reported examples of magnetoresistance effect films having the basic structure of sublayer/NiFe layer/CoFe layer/antimagnetic layer/fixed magnetic layer/antiferromagnetic layer, wherein Ta at a thickness of 50 angstroms is used for the sublayer, NiFe at a thickness of 35 Å is used for the NiFe layer, $Co_{90}Fe_{10}$ at a thickness of 40 Å is used for the CoFe layer, Cu at a thickness of 32 Å is used for the antimagnetic layer, $Co_{90}Fe_{10}$ at a thickness of 40 Å is used for the third antiferromagnetic layer, and FeMn at a thickness of 100 Å is used for the antiferromagnetic layer. In the fabrication process for the magnetoresistance effect devices having the basic structure of sublayer/NiFe layer/CoFe layer/antimagnetic layer/fixed magnetic layer/antiferromagnetic layer in-the prior art, in many cases, heat treatment at or above 200° C. is necessary in order to impart an exchange coupling force from the antiferromagnetic layer to the fixed magnetic layer. When this is done, if the crystallinity of the NiFe layer/CoFe layer/antimagnetic layer/fixed magnetic layer/antiferromagnetic layer region is not good, the interface in the vicinity of the antimagnetic layer will be disturbed, so that an adequate magnetoresistance variation rate cannot be obtained after heat treatment, which is a problem.

Even in cases where the type of antiferromagnetic layer used does not require heat treatment, moreover, a resist hardening process is nevertheless unavoidable for the write heads at the stage of actually fabricating recording/playback heads. For this reason, since such a process requires heat treatment at temperatures of 200° C. or higher, the resistance variation rate in the magnetoresistance effect film sharply declines at the stage of fabricating this on the actual heads. As a result, the designed output values cannot be obtained. This also is a problem.

SUMMARY OF THE INVENTION

An object of the present invention is to provide a magnetoresistance effect device wherein a sufficiently large resistance variation rate, sufficiently large exchange coupling magnetic field applied from the antiferromagnetic layer to the fixed magnetic layer, and sufficiently small coercive force in the free magnetic layer or layers is secured, while also securing heat resistance at 200° and above, together with a magnetoresistance effect sensor, magnetoresistance detection system, and magnetic storage system that use that device.

In order to attain the object stated above, the present invention employs, for the sublayer in a magnetoresistance effect device having a basic configuration of substrate/sublayer/NiFe layer/CoFe layer/antimagnetic layer/fixed magnetic layer/antiferromagnetic layer, Ta at a film thickness of 0.2 to 6.0 nm, Hf at a film thickness of 0.2 to 1.5 nm, or Zr at a film thickness of 0.2 to 2.5 nm. The operation of this device is now described, taking as an example a magnetoresistance effect device having the structure of substrate/sublayer/NiFe layer/CoFe layer/antimagnetic layer/fixed magnetic layer/antiferromagnetic layer. However, the operation is the same in magnetoresistance effect devices having different structures cited in the Claims.

When the Ta, Hf, or Zr film thickness is less than 0.2 nm in the sublayer, this is too thin and the sublayer does not function adequately. Firstly, to be more specific, in the /NiFe layer/CoFe layer/antimagnetic layer/fixed magnetic layer/antiferromagnetic layer portion, the crystal's (111) orientation is poor, and the crystal grain size becomes small, so that crystallinity deteriorates. Secondly, the conditions at the interfaces between the CoFe layer and antimagnetic layer and between the antimagnetic layer and fixed magnetic layer, that is, the interface roughness and interface mixing conditions, cease to be suitable. When the (111) orientation is poor and crystal grains are small, the size of the exchange coupling magnetic field applied from the antiferromagnetic layer to the fixed magnetic layer is insufficient, and the magnetoresistance effect device does not function effectively. Also, when the interface roughness and mixing conditions are not suitable, adequate values for the amount of magnetoresistance variation are no longer obtainable, so that it is no longer possible to obtain adequate playback output when configured in a recording and playback system.

If, on the other hand, the Ta film thickness exceeds 6.0 nm, the Hf film thickness exceeds 1.5 nm, or the Zr film thickness exceeds 2.5 nm, the structure of the sublayer manifestly becomes a body-centered cubic structure. However, it is when the sublayer has a body-centered cubic structure slightly degenerated from the amorphous that the (111) orientation and crystal grain size of the sublayer/NiFe layer/CoFe layer/antimagnetic layer/fixed magnetic layer/antiferromagnetic layer portion becomes good. For this reason, when a cubic structure appears manifestly in the sublayer, the (111) orientation deteriorates, and crystal grain size decreases. The effects of this are not as pronounced as when the thickness of the sublayer is thin, but it nevertheless appears as an increase in the coercive force in the free magnetic layers, that is, the /NiFe layer/CoFe layer portion. When the coercive force increases, there is an increase in noise (caused by the movement of the magnetic walls of the free magnetic layers in the magnetoresistance effect film) in the playback waveform when fabricated in a recording and playback head. This in turn leads to an increase in the playback error rate in a recording and playback system.

Thus it is effective to use, for the sublayer, Ta having a film thickness of from 0.2 nm to 6.0 nm, Hf having a film thickness of from 0.2 nm to 1.5 nm, or Zr having a film thickness of from 0.2 nm to 2.5 nm.

BRIEF DESCRIPTION OF THE DRAWINGS

FIG. 5 is a cross-sectional diagram of a magnetoresistance effect device to which the present invention pertains;

FIG. 6 is a cross-sectional diagram of a magnetoresistance effect device to which the present invention pertains;

FIG. 7 is a cross-sectional diagram of a magnetoresistance effect device to which the present invention pertains;

FIG. 8 is a cross-sectional diagram of a magnetoresistance effect device to which the present invention pertains;

FIG. 15 is a graph that represents the relationship between the MR ratio and Zr sublayer film thickness in a magnetoresistance effect device to which the present invention pertains;

FIG. 16 is a graph that represents the relationship between Hex and Zr sublayer film thickness in a magnetoresistance effect device to which the present invention pertains;

FIG. 18 is a table noting the characteristics of a magnetoresistance effect sensor for different types of sublayer in a magnetoresistance effect device to which the present invention pertains;

FIG. 19 is a table noting the characteristics of a magnetoresistance effect sensor for different types of antiferromagnetic layer in a magnetoresistance effect device to which the present invention pertains;

FIG. 20 is a table noting the characteristics of a magnetoresistance effect sensor for different types of antiferromagnetic layer in a magnetoresistance effect device to which the present invention pertains;

FIG. 21 is a table noting the characteristics of a magnetoresistance effect sensor for different NiFe layer film thicknesses in a magnetoresistance effect device to which the present invention pertains;

FIG. 22 is a table noting the characteristics of a magnetoresistance effect sensor for different Ni content in the composition of the NiFe layer in a magnetoresistance. effect device to which the present invention pertains;

FIG. 23 is a table noting the characteristics of a magnetoresistance effect sensor for different Fe content in the composition of the CoFe layer in a magnetoresistance effect device to which the present invention pertains;

FIG. 24 is a table noting the characteristics of a magnetoresistance effect sensor for different types of magnetoresistance effect devices to which the present invention pertains; and FIG. 25 is a sketch of a magnetic disk unit in the fabrication of which the present invention is applied.

DESCRIPTION OF THE PREFERRED EMBODIMENTS

Figure 1:
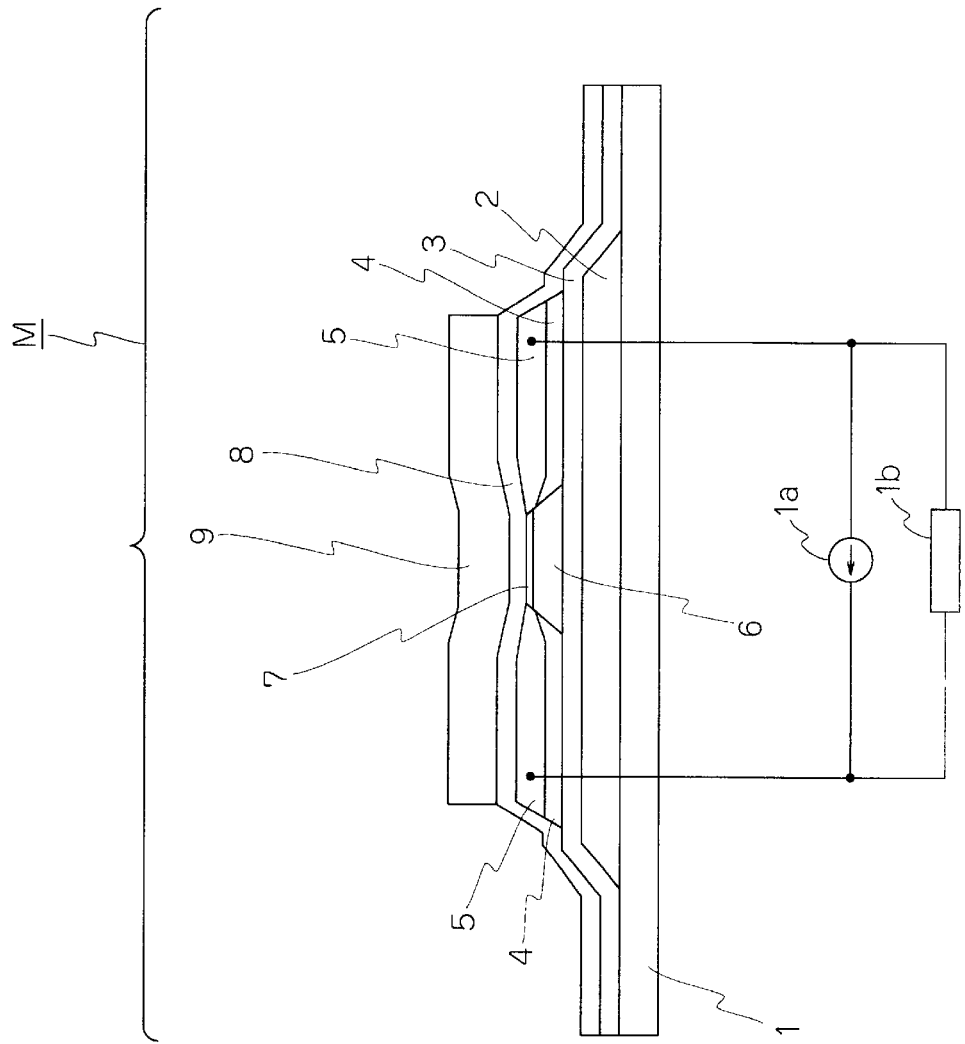
FIG. 1 is a conceptual diagram depicting the configuration of a magnetoresistance effect sensor in which is employed a magnetoresistance effect device to which the present invention pertains.
Figure 2:
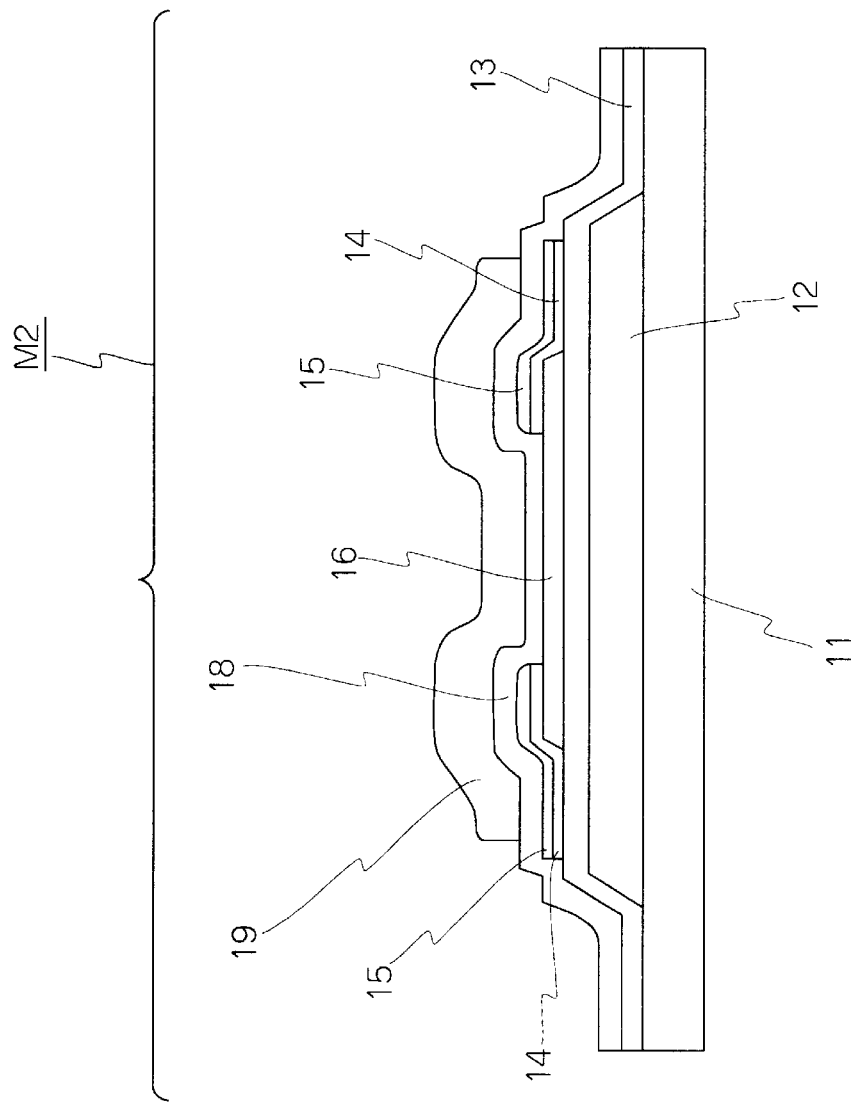
FIG. 2 is a conceptual diagram depicting the configuration of a magnetoresistance effect sensor in which is employed a magnetoresistance effect device to which the present invention pertains.

For a shielded type of magnetoresistance effect sensor in which the present invention is applied, one may use sensors having the structures diagrammed in FIG. 1 and FIG. 2. In the magnetoresistance effect sensor diagrammed in FIG. 1, a lower shield layer 2, lower gap layer 3, and magnetoresistance effect device 6 are laminated onto a substrate 1. A gap regulating insulation layer 7 may also be laminated on top of that. The lower shield layer 2 is often patterned by a photoresist (PR) process in a suitable size. The magnetoresistance effect device 6 is patterned in a shape of suitable size by a photoresist process, and a vertical bias layer 4 and lower electrode layer 5 are sequentially laminated so as to be in contact with the edges thereof. An upper gap layer 8 and upper shield layer 9 are sequentially laminated on top of that.

In the magnetoresistance effect sensor diagrammed in FIG. 2, a lower shield layer 12, lower gap layer 13, and magnetoresistance effect device 16 are laminated onto a substrate 11. The lower shield layer 12 is often patterned by a photoresist process in a suitable size. The magnetoresistance effect device 16 is patterned in a shape of suitable size by a photoresist process, and a vertical bias layer 14 and lower electrode layer 15 are sequentially laminated so that they overlap the top thereof. A gap layer 18 and upper shield layer 19 are sequentially laminated on top of that.

For the lower shield layer in the types of sensors diagrammed in FIGS. 1 and 2, NiFe, CoZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi alloy, FeAlSi, and ferronitride materials can be used, with the range of applicable film thicknesses therefor being from 0.3 to $10\mu$. For the lower gap layer, alumina, $SiO_2$, aluminum nitride, silicon nitride, and diamond-like carbon, etc., can be used, with the range of preferable thicknesses being from 0.01 to $0.20\mu$. For the lower electrode layer, Zr, Ta, or Mo may be used, either singly or alloyed or mixed, with a film thickness range of from 0.01 to $0.10\mu$ being preferred. For the vertical bias layer, one may use CoCrPt, CoCr, CoPt, CoCrTa, FeMn, NiMn, IrMn, PtPdMn, ReMn, PtMn, CrMn, Ni oxide, iron oxide, mixtures of Ni oxide and Co oxide, mixtures of Ni oxide and Fe oxide, two-layer films of Ni oxide/Co oxide, and two-layer films of Ni oxide/Fe oxide. For the gap regulating insulation layer it is possible to use alumina, $SiO_2$, aluminum nitride, silicon nitride, or diamond-like carbon, etc., with a thickness range of from 0.005 to $0.05\mu$ being preferable. For the upper gap layer, it is possible to use alumina, $SiO_2$, aluminum nitride, silicon nitride, or diamond-like carbon, etc., preferably within a thickness range of from 0.01 to $0.20\mu$. For the upper shield layer, the substances that can be used include NiFe, CoZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi alloy, FeAlSi, and ferronitride materials, within a film thickness range of from 0.3 to $10\mu$.

In FIG. 1, moreover, a magnetoresistance detection system in which the magnetoresistance effect sensor diagrammed in FIG. 1 is used is drawn in. This magnetoresistance detection system comprises the magnetoresistance effect sensor of FIG. 1, a current source 1a that produces the current that passes through the magnetoresistance effect sensor, and a resistance. detector 1b that detects changes in resistivity as a function of the magnetic field that is detected by the magnetoresistance effect sensor. The current source 1a is connected to the lower electrode layer 15 and supplies a constant current to the magnetoresistance effect device 16. The resistance detector 1b, which may be a voltmeter, for example, measures the value of the resistance of the magnetoresistance effect device 16.

Figure 3:
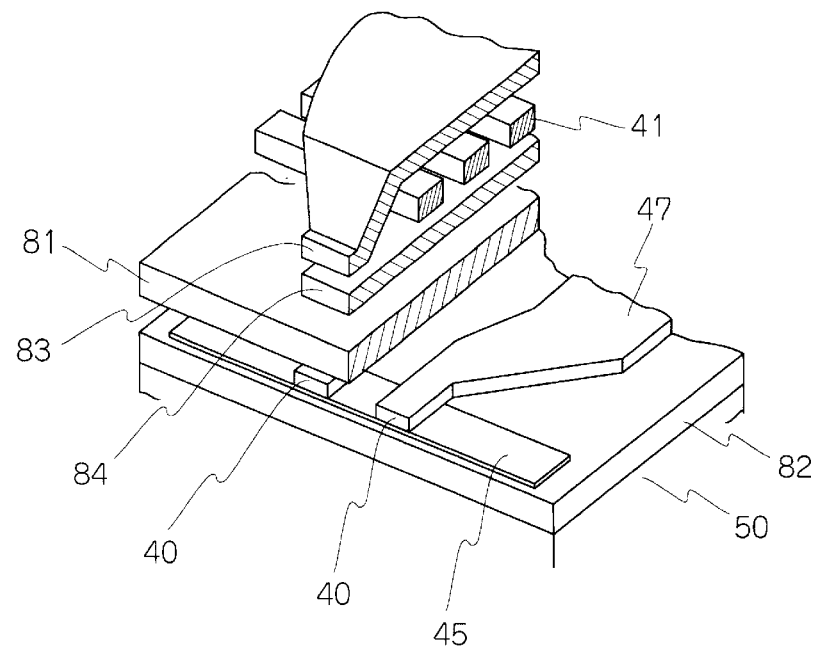
FIG. 3 is a conceptual diagram of a recording and playback head in which is employed a magnetoresistance effect device to which the present invention pertains.

These shielded magnetoresistance effect sensors, by forming write head units with inductive coils, become such as can be used as integrated recording-playback heads. FIG. 3 is a conceptual diagram of a recording-playback head. The recording-playback head comprises a playback head in which the magnetoresistance effect sensor of the present invention in used, and an inductive type recording head. In the example depicted here, a recording head is mounted for use in longitudinal magnetic recording, but the magnetoresistance effect device of the present invention may be combined with a vertical magnetic recording head and used for vertical recording.

The recording-playback head comprises a playback head made up of a lower shield film 82 on a substrate 50, a magnetoresistance effect device 45, an electrode 40, and an upper shield film 81; and a recording head made up of a lower magnetic film 84, a coil 41, and an upper magnetic film 83. Here, the upper shield film 81 and the lower magnetic film 84 may be made common. By means of this recording-playback head, signals are written onto a recording medium, and signals are read from a recording medium.

By forming the sensing component of the playback head and the magnetic gap in the recording head in a stacked position on the same slider in this manner, positioning can be done simultaneously on the same track. This recording-playback head is fabricated in a slider and mounted in a magnetic recording and playback system.

Figure 4:
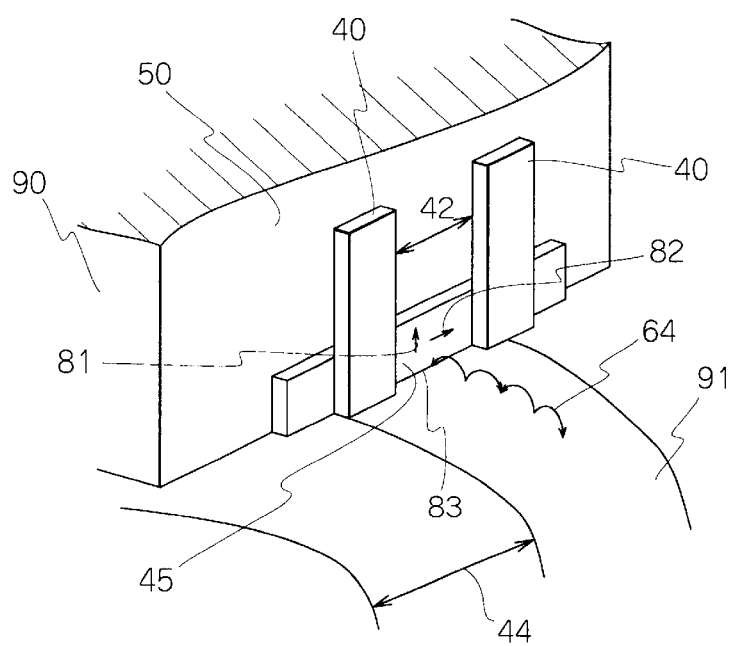
FIG. 4 is a conceptual diagram of a magnetic recording and playback unit in which is employed a magnetoresistance effect device to which the present invention pertains.

FIG. 4 is a conceptual diagram of a magnetic recording and playback unit in which the magnetoresistance effect device of the present invention is used. The magnetoresistance effect device 45 and electrode film 40 are formed on the substrate 50 which functions also as a head slider 90. This is positioned above a magnetic recording medium 91 and performs playback. The magnetic recording medium 91 turns, so that the head slider 90 describes a relative motion facing the magnetic recording medium 91, either at a height of $0.2\mu$ or less, or in contact therewith. By means of this mechanism, the magnetoresistance effect device 45 is established in a position from which it can read magnetic signals recorded on the magnetic recording medium 91 from the leakage magnetic field thereof.

FIGS. 5 through 8 are conceptual diagrams of film configurations for magnetoresistance effect devices concerning the present invention. The magnetoresistance effect device diagrammed in FIG. 5 exhibits a structure wherein a sublayer 101, NiFe layer 102, non-magnetic layer 104, MR-enhancing layer 105, fixed magnetic layer 106, antiferromagnetic layer 107, and protective layer 108 are sequentially laminated onto a substrate 100. The magnetoresistance effect device diagrammed in FIG. 6 exhibits a structure wherein a sublayer 101, NiFe layer 102, CoFe layer 103, non-magnetic layer 104, MR-enhancing layer 105, fixed magnetic layer 106, antiferromagnetic layer 107, and protective layer 108 are sequentially laminated onto a substrate 100. The magnetoresistance effect device diagrammed in FIG. 7 exhibits a structure wherein a sublayer 101, NiFe layer 102, non-magnetic layer 104, fixed magnetic layer 106, antiferromagnetic layer 107, and protective layer 108 are sequentially laminated onto a substrate 100. And the magnetoresistance effect device diagrammed in FIG. 8 exhibits a structure wherein a sublayer 101, NiFe layer 102, CoFe layer 103, non-magnetic layer 104, MR-enhancing layer 105, fixed magnetic layer 106, antiferromagnetic layer 107, and protective layer 108 are sequentially laminated onto a substrate 100.

For the sublayer, either Ta at 0.2 to 6.0 nm, Hf at 0.2 to 1.5 nm, or Zr at 0.2 to 2.5 nm is used. For the NiFe layer, an Ni composition of 78 to 84 at % is desirable. The film thickness should be 1 to 10 nm or so. For the CoFe layer, a Co composition of 86 to 99 at % is desirable. The film thickness should be 1 to 5 nm or so. For the non-magnetic layer, one may use Cu, Cu to which 1 to 20 at % or so of Ag has been added, Cu to which 1 to 20 at % or so of Re has been added, or a Cu-Au alloy. A film thickness of 2 to 4 nm is preferable. For the MR-enhancing layer, one may use Co, NiFeCo, or FeCo, etc., or, alternatively, CoFeB, CoZrMo, CoZrNb, CoZr, CoZrTa, CoHf, CoTa, CoTaHf, CoNbHf, CoZrNb, CoHfPd, CoTaZrNb, or CoZrMoNi alloys or amorphous magnetic materials. The film thickness should be from 0.5 to 5 nm or so. When an MR-enhancing layer is not used, the MR ratio will drop slightly, compared to when one is used, but the number of processes required for fabrication is decreased by not using one. For the fixed magnetic layer, one may employ an element, alloy, or laminated film selected from a group based on Co, Ni, and Fe. The film thickness should be from 1 to 50 nm or so. For the antiferromagnetic layer, one may use FeMn, NiMn, IrMn, PtPdMn, ReMn, PtMn, CrMn, Ni oxide, Fe oxide, mixtures of Ni and Co oxides, mixtures of Ni and Fe oxides, Ni oxide/Co oxide two-layer film, or Ni oxide/Fe oxide two-layer film, etc. For the protective layer, an oxide or nitride of the group made up of Al, Si, Ta, and Ti, an element of the group made up of Cu, Au, Ag, Ta, Hf, Zr, Ir, Si, Pt, Ti, Cr, Al, and C, a mixture thereof, or a multi-layer film thereof, may be used. By using a protective layer, corrosion resistance is enhanced, but not using one, conversely, reduces the number of fabrication steps required and thus enhances productivity.

The characteristics of a magnetoresistance effect device configured as in FIG. 5, and using Ta for the sublayer 101, were investigated. The substrate 100 used was a substrate of Corning 7059 glass having a thickness of 1.1 nm. $Ni_{81}NFe_{19}$ (at %) at 8.0 nm was used for the NiFe layer 102, Cu at 2.8 nm for the non-magnetic layer 104, $Co_{90}Fe_{10}$ (at %) at 0.4 nm for the MR-enhancing layer 105, $Ni_{81}Fe_{19}$ (at %) at 2.6 nm for the fixed magnetic layer 106, NiMn at 30 nm for the antiferromagnetic layer 107, and Ta at 3.0 nm for the protective layer 108. The compositions of each of these layers represents a target analysis value when forming films by sputtering (with an analysis measurement error of ±0.5%). The compositions of the films themselves were not measured (the same caveat applying hereinafter).

Figure 9:
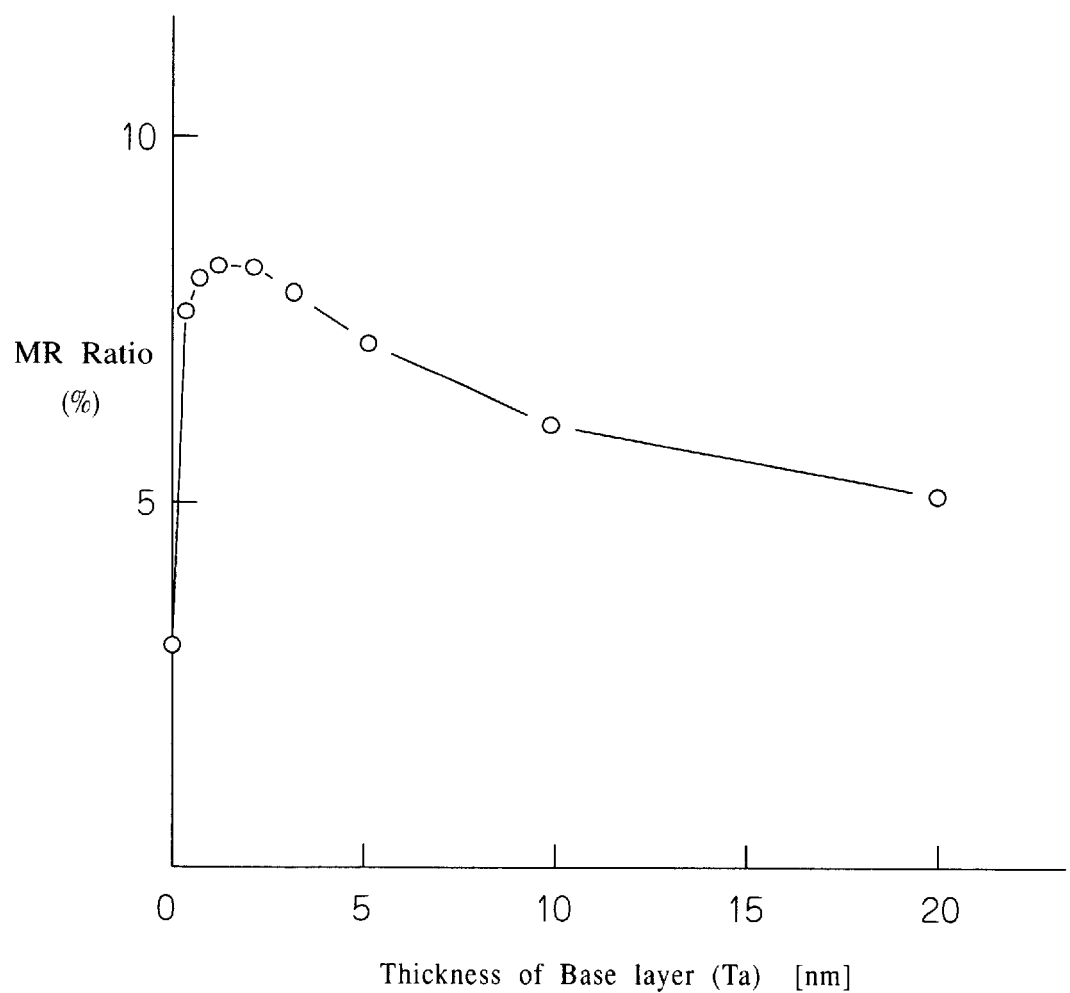
FIG. 9 is a graph that represents the relationship between the MR ratio and Ta sublayer film thickness in a magnetoresistance effect device to which the present invention pertains.

FIG. 9. graphs the relationship between the film thickness of a Ta sublayer and the MR ratio (rate of change in magnetoresistance). The MR ratio rises sharply as the film thickness of the Ta sublayer increases. After reaching a maximum at 1 to 2 nm, however, the MR ratio gradually declines. The MR ratio is relatively high, at 5% or above, in the range of Ta film thickness of 0.2 to 20 nm. The reason why the MR ratio is high within this range is that, with the optimization of the sublayer film thickness, the crystallinity of the NiFe layer/Cu layer/NiFe layer region is enhanced, whereupon heat resistance is improved, as a result of which, layer disturbances in the vicinity of the Cu layer due to heat treatment after the formation of the magnetoresistance effect device films are suppressed.

Figure 10:
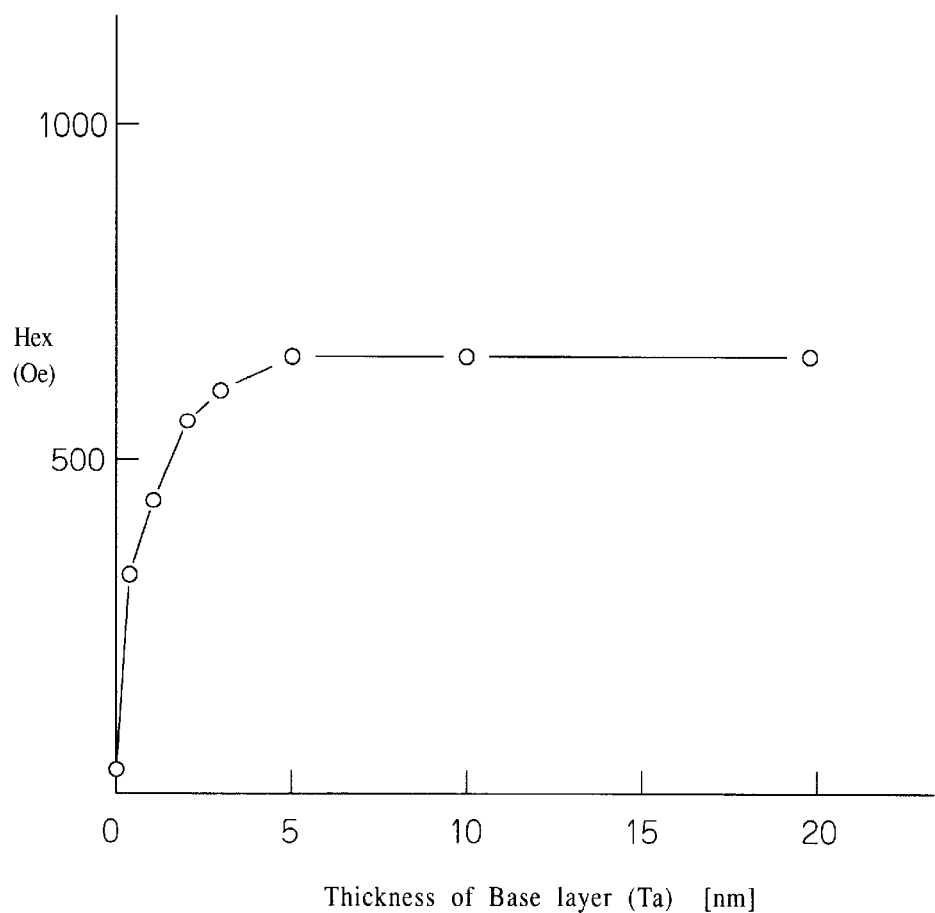
FIG. 10 is a graph that represents the relationship between Hex and Ta sublayer film thickness in a magnetoresistance effect device to which the present invention pertains.

FIG. 10 graphs the relationship between the film thickness of a Ta sublayer and the Hex (exchange coupling magnetic field) applied to the fixed magnetic layer from the antiferromagnetic layer. Hex simply increases as the Ta film thickness increases, becoming more or less constant above 5 nm. Hex is comparatively high at 300 Oe or above in the region where the Ta sublayer film thickness is above 0.2 nm.

Figure 11:
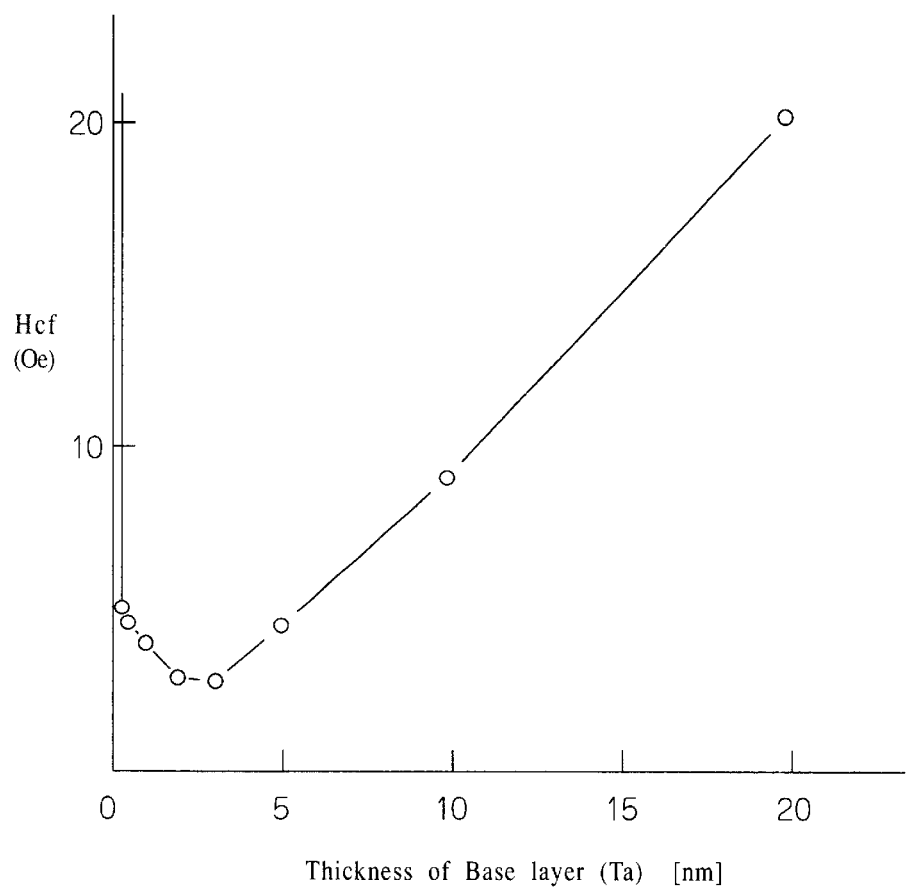
FIG. 11 is a graph that represents the relationship between Hcf and Ta sublayer film thickness in a magnetoresistance effect device to which the present invention pertains.

FIG. 11 graphs the relationship between the film thickness of a Ta sublayer and the Hcf (coercive force) of the NiFe/CoFe part. Hcf declines precipitously with an increase in the Ta sublayer film thickness, and then increases after reaching a minimum in the vicinity of 2 to 3 nm. Hcf is comparatively small at 5 Oe or lower in the range of Ta film thickness of 0.2 to 6 nm. From the foregoing, we can see that a good Ta film thickness range for the MR ratio, Hex, and Hcf is from 0.2 to 6 nm.

The characteristics of a magnetoresistance effect device configured as in FIG. 5, and using Hf for the sublayer 101, were investigated. The substrate 100 used was a substrate of Corning 7059 glass having a thickness of 1.1 nm. $Ni_{81}NFe_{19}$ (at %) at 8.0 nm was used for the NiFe layer 102, Cu at 2.8 nm for the non-magnetic layer 104, $Co_{90}Fe_{10}$ (at %) at 0.4 nm for the MR-enhancing layer 105, $Ni_{81}Fe_{19}$ (at %) at 2.6 nm for the fixed magnetic layer 106, $Ni_{46}Mn_{54}$ at 30 nm for the antiferromagnetic layer 107, and Hf at 3.0 nm for the protective layer 108. The magnetoresistance effect device was subjected to heat treatment for 5 hours at 270° C. in a vacuum after film formation in order to obtain adequately large values for the exchange coupling applied from the antiferromagnetic layer to the fixed magnetic layer.

Figure 12:
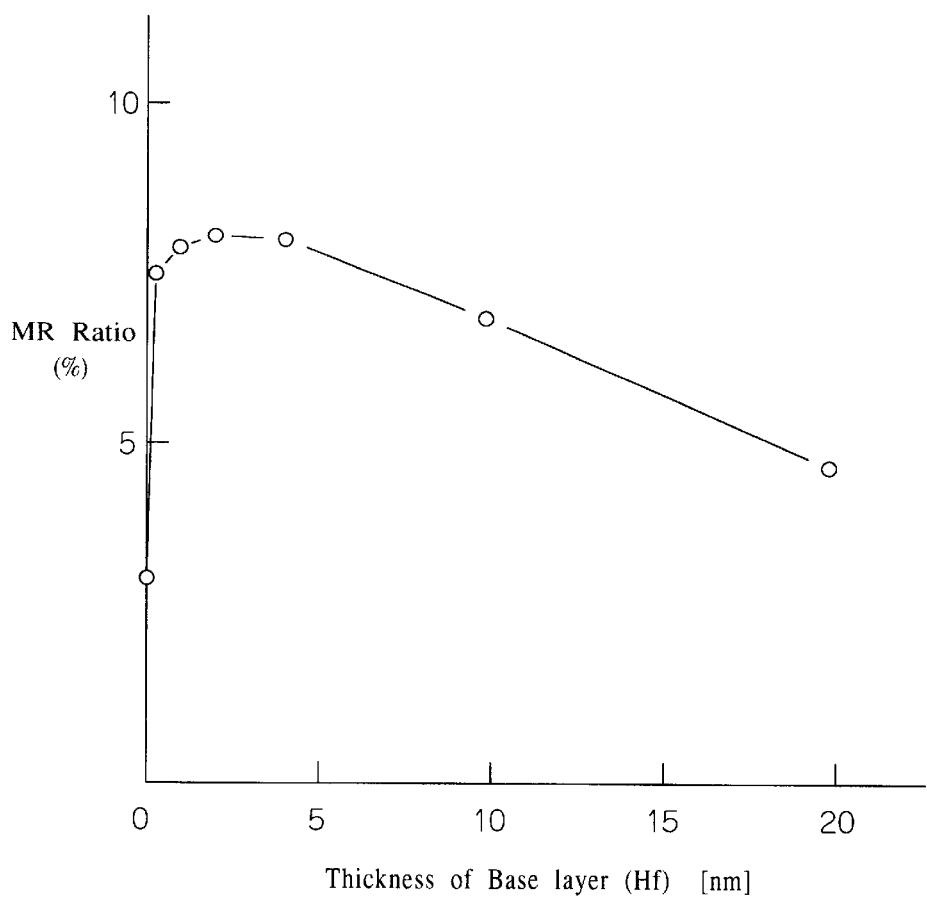
FIG. 12 is a graph that represents the relationship between the MR ratio and Hf sublayer film thickness in a magnetoresistance effect device to which the present invention pertains.

FIG. 12 plots the MR ratio (rate of change in magnetoresistance) against the Hf sublayer film thickness. The MR ratio increases sharply as the Hf sublayer film thickness increases, then gradually declines after reaching a maximum at from 2 to 3 nm. The MR ratio is comparatively high at 5% or higher in the range of Hf film thickness of 0.2 to 19 nm. The reason why the MR ratio is high in this range is that, with the optimization of the sublayer film thickness, the crystallinity of the NiFe layer/Cu layer/CoFe layer/NiFe layer portion is enhanced, whereupon heat resistance is improved, as a result of which, layer disturbances in the vicinity of the Cu layer due to heat treatment after the formation of the magnetoresistance effect device films are suppressed.

Figure 13:
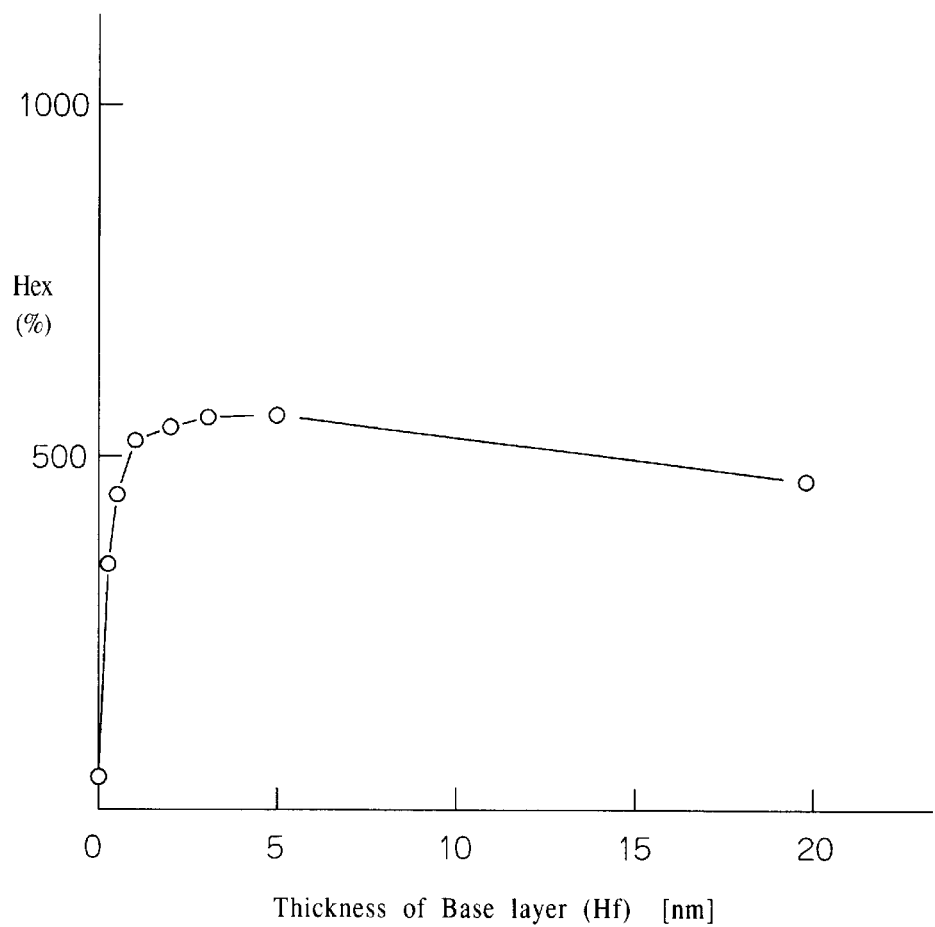
FIG. 13 is a graph that represents the relationship between Hex and Hf sublayer film thickness in a magnetoresistance effect device to which the present invention pertains.
Figure 14:
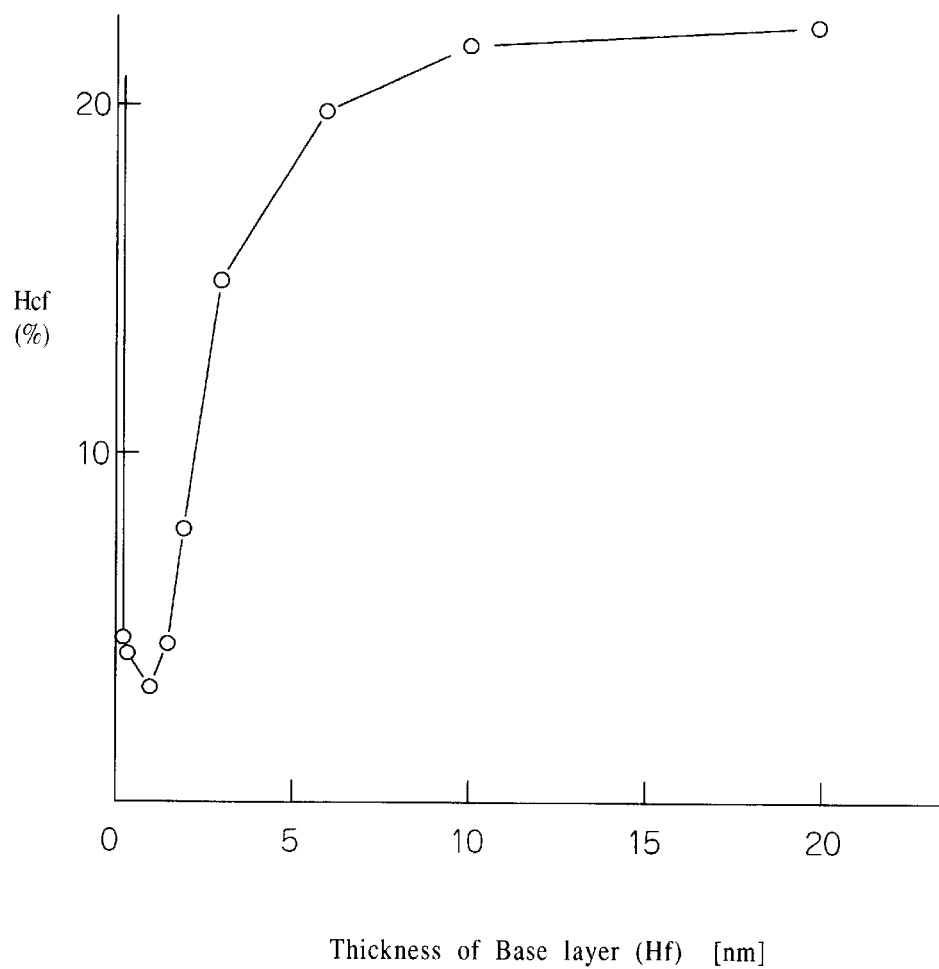
FIG. 14 is a graph that represents the relationship between Hcf and Hf sublayer film thickness in a magnetoresistance effect device to which the present invention pertains.

FIG. 13 graphs the relationship between the Hf sublayer film thickness and the Hex (exchange coupling magnetic field) that is applied from the antiferromagnetic layer to the fixed magnetic layer. Hex simply increases as the Hf sublayer film thickness increases, becoming more or less constant above 4 nm. Hex is comparatively high at 300 Oe or above in the region where the Hf film thickness is 0.2 nm or greater. FIG. 14 plots the Hcf (coercive force) of the NiFe/CoFe portion against Hf sublayer film thickness. Hcf declines precipitously with increasing Hf sublayer film thickness, and then increases after reaching a minimum in the vicinity of 1 nm. Hcf is comparatively small at 50 Oe or below in the range of Hf film thickness of 0.2 to 1.5 nm. Accordingly, we can see that the range for good MR ratio, Hex, and Hcf is a Hf film thickness of from 0.2 to 1.5 nm.

The characteristics of a magnetoresistance effect device configured as in FIG. 5, and using Zr for the sublayer 101, were investigated. The substrate 100 used was a substrate of Corning 7059 glass having a thickness of 1.1 nm. $Ni_{81}NFe_{19}$ (at %) at 8.0 nm was used for the NiFe layer 102, Cu at 2.8 nm for the non-magnetic layer 104, $Co_{90}Fe_{10}$ (at %) at 0.4 nm for the MR-enhancing layer 105, $Ni_{81}Fe_{19}$ (at %) at 2.6 nm for the fixed magnetic layer 106, NiMn at 30 nm for the antiferromagnetic layer 107, and Zr at 3.0 nm for the protective layer 108.

FIG. 15 plots the MR ratio (rate of change in magnetoresistance) against the film thickness of a Zr sublayer. The MR ratio increases sharply as the Zr sublayer film thickness increases, and then gradually decreases after reaching a maximum at 1 to 2 nm. The MR ratio is comparatively high at 5% in the range of Zr film thickness of 0.2 to 20 nm. The MR ratio is high in this range because, due to the optimization of the sublayer film thickness, the crystallinity of the NiFe layer/Cu layer/CoFe layer/NiFe layer region is enhanced, whereupon heat resistance is improved, as a result of which, layer disturbances in the vicinity of the Cu layer due to heat treatment after the formation of the magnetoresistance effect device films are suppressed.

Figure 17:
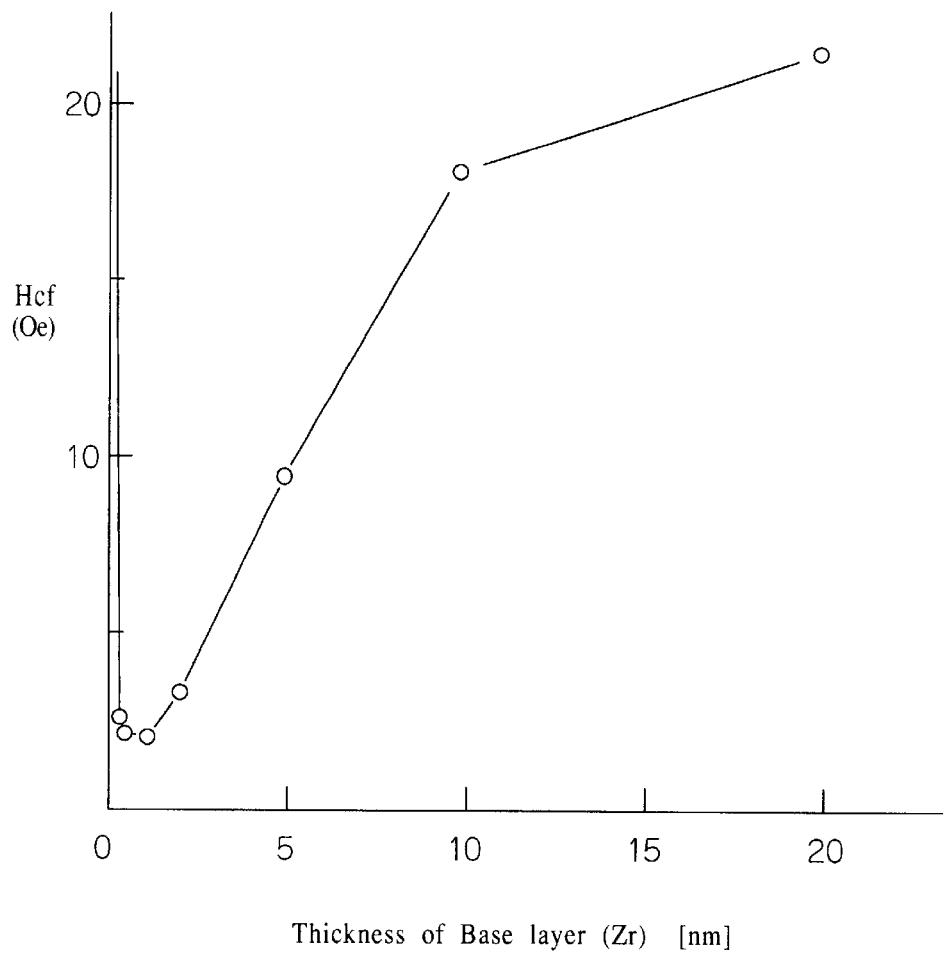
FIG. 17 is a graph that represents the relationship between Hcf and Zr sublayer film thickness in a magnetoresistance effect device to which the present invention pertains.

FIG. 16 plots the relationship between the Zr sublayer film thickness and the Hex (exchange coupling magnetic field) applied to the fixed magnetic layer from the antiferromagnetic layer. Hex increases simply as Zr film thickness increases, becoming more or less constant above 4 nm. Hex is comparatively high at 300 Oe or above in the region where the Zr sublayer film thickness is above 0.2 nm. FIG. 17 plots the Hcf (coercive force) of the NiFe/CoFe portion against the Zr sublayer film thickness. Hcf decreases precipitously as the Zr sublayer film thickness increases, and then increases after reaching a maximum in the vicinity of 1 nm. Hch is comparatively small, at 5 Oe or below, in the Zr film thickness range of 0.2 to 2.5 nm. Accordingly, we can see that the MR ratio, Hex, and Hcf are all good in a Zr film thickness range of 0.2 to 2.5 nm. Next are discussed examples in which these magnetoresistance effect devices are applied to shielded type magnetoresistance effect sensors.

Magnetoresistance effect sensors of the type depicted in FIG. 1 were produced using magnetoresistance effect devices to which the present invention pertains. NiFe was used as the lower shield layer and alumina as the lower gap layer. The magnetoresistance effect devices used where fabricated to a size of 1×1$\mu$, photoresist-processed in a configuration of sublayer/$Ni_{82}Fe_{18}$ (7 nm)/$Co_{90}Fe_{10}$ (1.0 nm)/Cu (2.5 nm)/$Co_{90}Fe_{10}$ (1 nm)/$Ni_{46}Mn_{54}$ (30 nm)/Ta (3 nm)

Magnetoresistance effect devices were fabricated using different types of sublayer. CoCrPt and Mo lower electrode layers were laminated so as to be in contact with the edges thereof. Alumina was used for the upper gap layers and NiFe for the upper shield layers. These magnetoresistance effect sensors were fabricated into integrated recording/playback heads and slider-fabricated, and data were recorded and played back on a CoCrTa-based magnetic recording medium. At this time, the write track width was made 1.5$\mu$, the write gap 0.2$\mu$, the read track width 1.0$\mu$, and the read gap 0.21$\mu$. The coercive force of this magnetic recording medium is 2.5 kOe. The recording mark length was varied and playback output measured. The results of these measurements are given in FIG. 18.

Magnetoresistance effect sensors of the type depicted in FIG. 1 were produced using magnetoresistance effect devices to which the present invention pertains. NiFe was used as the lower shield layer and alumina as the lower gap layer. The magnetoresistance effect devices used where fabricated to a size of 1×1$\mu$, photoresist-processed in a configuration of Ta (3 nm)/$Ni_{82}Fe_{18}$ (7 nm)/$Co_{90}Fe_{10}$ (1.0 nm)/Cu (2.5 nm)/$Co_{90}Fe_{10}$ (1 nm)/antiferromagnetic layer/ Ta (3 nm)

Magnetoresistance effect devices were fabricated using different types of antiferromagnetic layer. CoCrPt and Mo lower electrode layers were laminated so as to be in contact with the edges thereof. Alumina was used for the upper gap layers and NiFe for the upper shield layers. These magnetoresistance effect sensors were fabricated into integrated recording/playback heads and slider-fabricated, and data were recorded and played back on a CoCrTa-based magnetic recording medium. At this time, the write track width was made 1.5$\mu$, the write gap 0.2$\mu$, the read track width 1.0$\mu$, and the read gap 0.21$\mu$. The coercive force of this magnetic recording medium is 2.5 kOe. The recording mark length was varied and playback output measured. The results of these measurements are given in FIGS. 19 and 20. Magnetoresistance effect sensors of the type depicted in FIG. 1 were produced using magnetoresistance effect devices to which the present invention pertains. NiFe was used as the lower shield layer and alumina as the lower gap layer. The magnetoresistance effect devices used where fabricated to a size of 1×1$\mu$, photoresist-processed in a configuration of Ta (3 nm)/$Ni_{82}Fe_{18}$ (7 nm)/$Co_{90}Fe_{10}$ (1.0 nm)/Cu (2.5 nm)/ $Co_{90}Fe_{10}$ (1 nm)/$Ni_{46}Mn_{54}$ (30 nm)/Ta (3 nm).

Magnetoresistance effect devices were fabricated using different film thicknesses in the NiFe layer. CoCrPt and Mo lower electrode layers were laminated so as to be in contact with the edges thereof. Alumina was used for the upper gap layers and NiFe for the upper shield layers. These magnetoresistance effect sensors were fabricated into integrated recording/playback heads and slider-fabricated, and data were recorded and played back on a CoCrTa-based magnetic recording medium. At this time, the write track width was made 1.5μ, the write gap 0.2μ, the read track width 1.0μ, and the read gap 0.21μ. The coercive force of this magnetic recording medium is 2.5 kOe. The recording mark length was varied and playback output measured. The results of these measurements are given in FIG. 21. Magnetoresistance effect sensors of the type depicted in FIG. 1 were produced using magnetoresistance effect devices to which the present invention pertains. NiFe was used as the lower shield layer and alumina as the lower gap layer. The magnetoresistance effect devices used where fabricated to a size of 1×1μ, photoresist-processed in a configuration of Ta (3 nm)/NiFe (7 nm)/$Co_{90}Fe_{10}$ (1.0 nm)/Cu (2.5 nm)/$Co_{90}Fe_{10}$ (1 nm)/$Ni_{46}Mn_{54}$ (30 nm)/Ta (3 nm).

Magnetoresistance effect devices were fabricated, varying the composition of the NiFe layer. CoCrPt and Mo lower electrode layers were laminated so as to be in contact with the edges thereof. Alumina was used for the upper gap layers and NiFe for the upper shield layers. These magnetoresistance effect sensors were fabricated into integrated recording/playback heads and slider-fabricated, and data were recorded and played back on a CoCrTa-based magnetic recording medium. At this time, the write track width was made 1.5μ, the write gap 0.2μ, the read track width 1.0μ, and the read gap 0.21μ. The coercive force of this magnetic recording medium is 2.5 kOe. The recording mark length was varied and playback output measured. The results of these measurements are given in FIG. 22.

Magnetoresistance effect sensors of the type depicted in FIG. 1 were produced using magnetoresistance effect devices to which the present invention pertains. NiFe was used as the lower shield layer and alumina as the lower gap layer. The magnetoresistance effect devices used where fabricated to a size of 1×1μ, photoresist-processed in a configuration of Ta (3 nm)/$Ni_{82}Fe_{18}$ (7 nm)/CoFe (1.0 nm)/Cu (2.5 nm)/$Co_{90}Fe_{10}$ (1 nm)/$Ni_{46}Mn_{54}$ (30 nm)/Ta (3 nm).

Magnetoresistance effect devices were fabricated, varying the composition of the CoFe layer. CoCrPt and Mo lower electrode layers were laminated so as to be in contact with the edges thereof. Alumina was used for the upper gap layers and NiFe for the upper shield layers. These magnetoresistance effect sensors were fabricated into integrated recording/playback heads and slider-fabricated, and data were recorded and played back on a CoCrTa-based magnetic recording medium. At this time, the write track width was made 1.5μ, the write gap 0.2μ, the read track width 1.0μ, and the read gap 0.21μ. The coercive force of this magnetic recording medium is 2.5 kOe. The recording mark length was varied and playback output measured. The results of these measurements are given in FIG. 23.

Magnetoresistance effect sensors of the type depicted in FIG. 1 were produced using magnetoresistance effect devices to which the present invention pertains. NiFe was used as the lower shield layer and alumina as the lower gap layer. The respective configurations diagrammed in FIG. 5 through FIG. 8 were used for the magnetoresistance effect device. Ta (3 nm) was used for the sublayer 101, $Ni_{82}Fe_{18}$ (7 nm) for the NiFe layer 102, Co 90 Fe 10 (1.0 nm) for the CoFe layer 103, Cu (2.5 nm) for the non-magnetic layer 104, Co (1 nm) for the MR-enhancing layer 105, $Ni_{80}Fe_{20}$ (3 nm) for the fixed magnetic layer 106, $Ni_{46}Mn_{54}$ (30 nm) for the antiferromagnetic layer 107, and Ta (3 nm) for the protective layer 108. These magnetoresistance effect devices were fabricated by photoresist processing to a size of 1×1μ. CoCrPt and Mo lower electrode layers were laminated so as to be in contact with the edges thereof. Alumina was used for the upper gap layers and NiFe for the upper shield layers. These magnetoresistance effect sensors were fabricated into integrated recording/playback heads and slider-fabricated, and data were recorded and played back on a CoCrTa-based magnetic recording medium. At this time, the write track width was made 1.5μ, the write gap 0.2μ, the read track width 1.0μ, and the read gap 0.21μ. The coercive force of this magnetic recording medium is 2.5 kOe. The recording mark length was varied and playback output measured.

Next, magnetoresistance effect sensors of the type depicted in FIG. 2 were produced using magnetoresistance effect devices to which the present invention pertains. FeTaN was used as the lower shield layer and amorphous carbon as the lower gap layer. The magnetoresistance effect devices used where fabricated to a size of 1×1μ, photoresist-processed in a configuration of Ta (3 nm)/$Ni_{82}Fe_{18}$ (7 nm)/$Co_{90}Fe_{10}$ (3 nm)/Cu (2.5 nm)/$Co_{90}Ge_{10}$ (3 nm)/$Ni_{46}Mn_{54}$ (20 nm)/Ta (3 nm). CoCrPt and Mo lower electrode layers were laminated so as to partially overlap this device. Alumina was used for the upper gap layers and NiFe for the upper shield layers. These magnetoresistance effect sensors were fabricated into integrated recording/playback heads and slider-fabricated, and data were recorded and played back on a CoCrTa-based magnetic recording medium. At this time, the write track width was made 1.5μ, the write gap 0.2μ, the read track width 1.0μ, and the read gap 0.21μ. The coercive force of this magnetic recording medium is 2.5 kOe. When the recording mark length was varied and playback output measured, the frequency was 154 kFCI at the mark length where the playback output was reduced by half. The playback output was 1.7 mV peak to peak, and a noiseless waveform of good symmetry was obtained. The S/N ratio was 26.4 dB and the error rate was $10^{-6}$ or lower. When this head was subjected to environmental testing at 80° C. and 500 Oe, the error rate exhibited no change whatever for the first 2500 hours. When the head was subjected to an electrification test with a current density of $2 \times 10^7$ (A/cm$^2$) at an environmental temperature of 80° C., no variation in either resistance value or in resistance variation rate were observed for the first 1000 hours.

A magnetic disk unit in which the present invention has been applied is next described, making reference to FIG. 25. The magnetic disk unit comprises three magnetic disks 22 on a base 20. A head drive circuit, signal processing circuit, and input/output interface are provided inside the base 20 (but not shown in the drawing). The unit is connected externally via a 32-bit bus line 24. Six heads 26 are positioned, for both sides of the magnetic disks 22. Also provided (but not shown) are an actuator 28 such as a voice coil motor for driving the heads 26, the drive and control circuitry therefor, and a direct-drive spindle motor to drive the disks. The diameter of the disks is 46 mm, using from 10 mm to 40 mm of that diameter for the data area. Higher density can be achieved by using an embedded servo mechanism which does not require a servo surface. This apparatus can be directly connected to a small computer to serve as an external memory unit. A cache memory is included in the I/O interface to handle a bus line operating at a transfer rate of from 5 to 20 megabytes/second. By connecting a plurality of these apparatuses together, and employing an external controller, it is possible to configure a large-capacity magnetic disk unit.

If the magnetoresistance effect devices to which the present invention pertains are employed, and sublayers of Ta, Hf, or Zr are formed at the prescribed film thickness, it is possible both to enhance the crystallinity of the magnetoresistance effect device and to improve heat resistance. As a consequence, it is possible to improve the magnetoresistance variation rate subsequent to film formation in and heat-treatment of the magnetoresistance effect devices, so that magnetoresistance effect devices exhibiting high playback output, low noise levels, high S/N ratios, low error rates, and outstanding device reliability can be obtained, together with magnetoresistance effect sensors, magnetoresistance detection systems, and magnetic storage systems using such devices.

The invention may be embodied in other specific forms without departing from the spirit or essential characteristic thereof. The present embodiments is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 9-123796 (Filed on May 14th, 1997) including specification, claims, drawings and summary are incorporated herein by reference in its entirety.

What is claimed is:

1. A magnetoresistance effect device comprising:
a substrate;
a sublayer directly on and contacting said substrate, said sublayer being one of (1) Ta that is not less than 0.2 nm thick and less than 1.0 nm thick, (2) Hf that is not less than 0.2 nm thick and not more than 1.5 nm thick, and (3) Zr that is not less than 0.2 nm thick and not more than 2.5 nm thick;
an NiFe layer directly on and contacting said sublayer;
a non-magnetic layer directly on and contacting said NiFe layer;
a fixed magnetic layer directly on and contacting said non-magnetic layer; and
an antiferromagnetic layer directly on and contacting said fixed magnetic layer.

2. The magnetoresistance effect device according to claim 1, wherein said sublayer has a thickness less than 1.0 nm.

3. A magnetoresistance effect device comprising:
a substrate;
a sublayer directly on and contacting said substrate, said sublayer being one of (1) Ta that is not less than 0.2 nm thick and less than 1.0 nm thick, (2) Hf that is not less than 0.2 nm thick and not more than 1.5 nm thick, and (3) Zr that is not less than 0.2 nm thick and not more than 2.5 nm thick;
an NiFe layer directly on and contacting said sublayer;
a CoFe layer directly on and contacting said NiFe layer;
a non-magnetic layer directly on and contacting said CoFe layer;
an MR-enhancing layer directly on and contacting said non-magnetic layer;
a fixed magnetic layer directly on and contacting said MR-enhancing layer; and
an antiferromagnetic layer directly on and contacting said fixed magnetic layer.

4. The magnetoresistance effect device according to claim 3, wherein said sublayer has a thickness less than 1.0 nm.

5. A shielded magnetoresistance effect sensor comprising:
(a) a lower shield layer laminated on a substrate, the lower shield layer being formed in a prescribed pattern;
(b) a lower gap layer formed on the lower shield layer;
(c) a magnetoresistance effect device laminated on the lower gap layer;
(i) the magnetoresistance effect device comprises:
a sublayer directly on and contacting said lower gap layer, said sublayer being one of (1) Ta that is not less than 0.2 nm thick and less than 1.0 nm thick, (2) Hf that is not less than 0.2 nm thick and not more than 1.5 nm thick, and (3) Zr that is not less than 0.2 nm thick and not more than 2.5 nm thick , an NiFe layer directly on and contacting said sublayer, a non-magnetic layer directly on and contacting said NiFe layer, a fixed magnetic layer directly on and contacting said non-magnetic layer, and an antiferromagnetic layer directly on and contacting said fixed magnetic layer;
(ii) the magnetoresistance effect device is formed in a prescribed pattern;
(d) a vertical bias layer laminated so as to contact the edges of the magnetoresistance effect device;
(e) a lower electrode layer laminated on the vertical bias layer;
(f) an upper gap layer laminated on the lower electrode layer and on the magnetoresistance effect device; and
(g) an upper shield layer laminated on the upper gap layer.

6. The shielded magnetoresistance effect sensor according to claim 5, wherein said sublayer has a thickness less than 1.0 nm.

7. A shielded magnetoresistance effect sensor comprising:
(a) a lower shield layer laminated on a substrate, the lower shield layer being formed in a prescribed pattern;
(b) a lower gap layer formed on the lower shield layer;
(c) a magnetoresistance effect device laminated on the lower gap layer;
the magnetoresistance effect device comprises:
(i) a sublayer directly on and contacting said lower gap layer, said sublayer being one of (1) Ta that is not less than 0.2 nm thick and less than 1.0 nm thick, (2) Hf that is not less than 0.2 nm thick and not more than 1.5 nm thick, and (3) Zr that is not less than 0.2 nm thick and not more than 2.5 nm thick, an NiFe layer directly on and contacting said sublayer, a CoFe layer directly on and contacting said NiFe layer, a non-magnetic layer directly on and contacting said CoFe layer, an MR-enhancing layer directly on and contacting said non-magnetic layer, a fixed magnetic layer directly on and contacting said MR-enhancing layer, and an antiferromagnetic layer directly on and contacting said fixed magnetic layer; and
(ii) the magnetoresistance effect device is formed in a prescribed pattern;
(d) a vertical bias layer laminated so as to contact the edges of the magnetoresistance effect device;
(e) a lower electrode layer laminated on the vertical bias layer;
(f) an upper gap layer laminated on the lower electrode layer and on the magnetoresistance effect device; and
(g) an upper shield layer laminated on the upper gap layer.

8. The shielded magnetoresistance effect sensor according to claim 7, wherein said sublayer has a thickness less than 1.0 nm.

9. A magnetoresistance detection system comprising:
(a) a magnetoresistance effect sensor comprising:
(i) a lower shield layer laminated on a substrate, the shield layer formed in a designated pattern;
(ii) a lower gap layer laminated on the lower shield layer;

(iii) a magnetoresistance effect device laminated on the lower gap layer;

(iv) a vertical bias layer laminated so as to contact the edges of the magnetoresistance effect device;

(v) a lower electrode layer laminated on the vertical bias layer;

(vi) an upper gap layer laminated on the lower electrode layer and on the magnetoresistance effect device; and (vii) an upper shield layer laminated on the upper gap layer;

(b) a current source for producing a current that passes through the magnetoresistance effect sensor; and (c) a resistance detector that detects resistivity variation as a function of the magnetic field detected by the magnetoresistance effect sensor;

the magnetoresistance effect device comprises:

a sublayer directly on and contacting said lower gap layer, said sublayer being one of (1) Ta that is not less than 0.2 nm thick and less than 1.0 nm thick, (2) Hf that is not less than 0.2 nm thick and not more than 1.5 nm thick, and (3) Zr that is not less than 0.2 nm thick and not more than 2.5 nm thick, an NiFe layer directly on and contacting said sublayer, a non-magnetic layer directly on and contacting said NiFe layer, a fixed magnetic layer directly on and contacting said non-magnetic layer, and an antiferromagnetic layer directly on and contacting said fixed magnetic layer;

the magnetoresistance effect device is formed in a prescribed pattern.

10. The magnetoresistance detection system according to claim 9, wherein said sublayer has a thickness less than 1.0 nm.

11. A magnetoresistance detection system comprising:

(a) a magnetoresistance effect sensor comprising:

(i) a lower shield layer laminated on a substrate, the shield layer formed in a designated pattern;

(ii) a lower gap layer laminated on the lower shield layer;

(iii) a magnetoresistance effect device laminated on the lower gap layer;

the magnetoresistance effect device comprises:

a sublayer directly on and contacting said lower gap layer, said sublayer being one of (1) Ta that is not less than 0.2 nm thick and less than 1.0 nm thick, (2) Hf that is not less than 0.2 nm thick and not more than 1.5 nm thick, and (3) Zr that is not less than 0.2 nm thick and not more than 2.5 nm thick, an NiFe layer directly on and contacting said sublayer, a CoFe layer directly on and contacting said NiFe layer, a non-magnetic layer directly on and contacting said CoFe layer, an MR-enhancing layer directly on and contacting said non-magnetic layer, a fixed magnetic layer directly on and contacting said MR-enhancing layer, and an antiferromagnetic layer directly on and contacting said fixed magnetic layer;

the magnetoresistance effect device is formed in a prescribed pattern;

(iv) a vertical bias layer laminated so as to contact the edges of the magnetoresistance effect device;

(v) a lower electrode layer laminated on the vertical bias layer;

(vi) an upper gap layer laminated on the lower electrode layer and on the magnetoresistance effect device, and (vii) an upper shield layer laminated on the upper gap layer;

(b) a current source for producing a current that passes through the magnetoresistance effect sensor; and (c) a resistance detector that detects resistivity variation as a function of the magnetic field detected by the magnetoresistance effect sensor.

12. The magnetoresistance detection system according to claim 11, wherein said sublayer has a thickness less than 1.0 nm.

13. A magnetic storage system comprising:

(a) a magnetic storage medium having a plurality of tracks for data recording;

(b) a magnetic recording system for storing data on the magnetic storage medium;

(c) a magnetoresistance detection system comprising:

(i) a magnetoresistance effect sensor comprising:

a shield layer formed in a prescribed pattern and laminated on a substrate;

a lower gap layer laminated on the lower shield layer;

a magnetoresistance effect device laminated on the lower gap layer;

a vertical bias layer laminated so as to contact the edges of the magnetoresistance effect device;

a lower electrode layer laminated on the vertical bias layer;

an upper gap layer laminated on the lower electrode layer and on the magnetoresistance effect device; and an upper shield layer laminated on the upper gap layer;

(ii) a current source for producing a current that passes through the magnetoresistance effect sensor; and (iii) a resistance detector that detects resistivity variation as a function of the magnetic field detected by the magnetoresistance effect sensor; and (d) an actuator that couples the magnetoresistance detection system and the magnetic recording system;

the magnetoresistance effect device comprises:

a sublayer comprising Ta that is less than 1.0 nm thick and not less 0.2 nm thick and that is directly on and contacting said lower gap layer, an NiFe layer directly on and contacting said Ta sublayer, a non-magnetic layer directly on and contacting said NiFe layer, a fixed magnetic layer directly on and contacting said non-magnetic layer, and an antiferromagnetic layer directly on and contacting said fixed magnetic layer;

the magnetoresistance effect device is formed in a prescribed pattern; and the actuator moves a head unit of the magnetoresistance detection system and of the magnetic recording system over a selected track on the magnetic storage medium.

* * * * *